(12) United States Patent
Gamo

(10) Patent No.: US 6,274,969 B1
(45) Date of Patent: Aug. 14, 2001

(54) CHIP PIEZOELECTRIC FILTER

(75) Inventor: Masao Gamo, Takaoka (JP)

(73) Assignee: Murata Manufacturing Co., LTD, Kyoto (JP)

( * ) Notice: Subject to any disclaimer, the term of this patent is extended or adjusted under 35 U.S.C. 154(b) by 0 days.

(21) Appl. No.: 09/627,774

(22) Filed: Jul. 28, 2000

(30) Foreign Application Priority Data

Jul. 29, 1999 (JP) ................................................ 11-214877

(51) Int. Cl.[7] .................................................... H03H 9/54
(52) U.S. Cl. ........................ 310/366; 310/323; 310/340; 310/348; 310/367
(58) Field of Search ................................... 310/346, 367, 310/320, 366, 340, 348

(56) References Cited

U.S. PATENT DOCUMENTS

| | | | |
|---|---|---|---|
| 6,002,308 | * 12/1999 | Gamo | 310/366 |
| 6,011,451 | * 1/2000 | Gamo | 310/366 |
| 6,160,462 | * 8/1998 | Sugyama | 310/366 |

FOREIGN PATENT DOCUMENTS

09182183 * 7/1997 (JP).
10-335976 12/1998 (JP).

* cited by examiner

Primary Examiner—Elvin Enad
Assistant Examiner—Karen Addison
(74) Attorney, Agent, or Firm—Keating & Bennett, LLP

(57) ABSTRACT

A chip piezoelectric filter has a plurality of energy-trap piezoelectric filters and effectively minimizes unnecessary spurious components in areas other than passbands. In the chip piezoelectric filter, first and second piezoelectric substrates on which first and second energy-trap piezoelectric filter sections are provided, respectively, are stacked on each other and separated from each other via a spacer. Also, first and second housing substrates are individually stacked on upper and lower portions of the first and second piezoelectric substrates. A first cavity is provided in the spacer to prevent interference of vibrations of the first and second piezoelectric substrates. The area of the first cavity is larger than the area of each of second and third cavities individually formed on outer surfaces of the first and second piezoelectric substrates.

25 Claims, 8 Drawing Sheets

CHIP PIEZOELECTRIC FILTER

BACKGROUND OF THE INVENTION

1. Field of the Invention

The present invention relates to a chip piezoelectric filter that has a circuit configuration wherein a plurality of piezoelectric filter sections are electrically connected. More specifically, the present invention relates to a chip piezoelectric filter that has a configuration wherein each of a plurality of piezoelectric substrates has an energy-trap piezoelectric filter section provided thereon.

2. Description of the Related Art

In an intermediate-frequency stage filter of a mobile communication apparatus, such as a portable telephone, a piezoelectric filter of an energy-trap type is used. As with other electronic components, the piezoelectric filter of this type is also required to be configured as a chip component to enable surface-mounting.

An example of the piezoelectric filter of this type is disclosed in Japanese Unexamined Patent Application Publication No. 10-335976. FIGS. 7 and 8 show the conventional piezoelectric filter.

A piezoelectric filter 50 has a first piezoelectric substrate 51 and a second piezoelectric substrate 52 that are stacked on each other and separated from each other via a spacer 58. On each of the first and second piezoelectric substrate 51 and 52, an energy-trap piezoelectric filter section is provided. Also, a pair of resonant electrodes 53a and 53b is provided on the upper surface of the first piezoelectric substrate 51, and a common electrode (not shown) is arranged opposite to the resonant electrodes 53a and 53b with respect to the front and reverse surfaces thereof. The resonant electrodes 53a and 53b and the common electrode provide the energy-trap piezoelectric filter section that vibrates in a expansion oscillation mode.

On the upper surface of the second piezoelectric substrate 52, a common electrode 53c is provided. Similar to the first piezoelectric substrate 51, a pair of resonant electrodes (not shown) are arranged to oppose the common electrode 53c with respect to the front and reverse surfaces thereof. The pair of electrodes and the common electrode 53c define a second energy-trap piezoelectric filter section.

An opening 58a is provided in the spacer 58 to prevent interference of vibration of the energy-trap piezoelectric filter section. Also, confining substrates 60 and 61 are, respectively, stacked on outer main surfaces of the first and second piezoelectric substrates 51 and 52 via spacers 57 and 59.

The spacers 57 and 59 have an opening 57a and an opening 59a, respectively. The openings 57a and 59a are arranged to define cavities that prevent interference of vibrations of the first and second piezoelectric filter sections of the energy-trap type. Specifically, as shown in FIG. 8, a first cavity X, a second cavity Y, and a third cavity Z are provided. The first cavity X is provided between the first and second piezoelectric substrates 1 and 2. The second cavity Y is provided with the spacer 57 on an upper portion of the first piezoelectric substrate 51. The third cavity Z is provided with the spacer 59 in a lower portion of the second piezoelectric substrate 52. The sizes of the cavities X, Y, and Z are the same.

The described energy-trap piezoelectric filter is used as a bandpass filter that is required to reduce unnecessary spurious components of attenuation-frequency characteristics.

However, the energy-trap piezoelectric filter frequently produces large spurious components in areas close to passbands.

SUMMARY OF THE INVENTION

In order to solve the above-described problems, preferred embodiments of the present invention provide a chip piezoelectric filter that has a plurality of energy-trap filter sections and that effectively minimizes unnecessary spurious components, thereby achieving excellent passband characteristics.

According to one preferred embodiment of the present invention, a chip piezoelectric filter includes a first piezoelectric substrate on which a first energy-trap piezoelectric filter section is provided, a second piezoelectric substrate on which a second energy-trap piezoelectric filter section, a spacer that is stacked between the first piezoelectric substrate and the second piezoelectric substrate and that has an opening to define a first cavity arranged to prevent interference of vibrations of the first energy-trap piezoelectric filter section and the second energy-trap piezoelectric filter section, a first confining substrate stacked on a surface of the first piezoelectric substrate, which opposes the surface on which the spacer is stacked, to define a second cavity arranged to prevent interference of vibrations of the first piezoelectric filter section, and a second confining substrate stacked on a surface of the second piezoelectric substrate, which opposes the surface on which the spacer is stacked, to define a third cavity arranged to prevent interference of vibrations of the second piezoelectric filter section. In the preferred embodiment described above, the area of the first cavity is larger than the area of each of the second cavity and the third cavity.

As described above, the first and second piezoelectric substrates have the first and second energy-trap piezoelectric filter sections, respectively. These substrates are stacked to define the first cavity therebetween. Also, the confining substrates are individually stacked on outer main surfaces of the first and second piezoelectric substrates to define the second and third cavities. The area of the first cavity is preferably larger than the area of each of the second and third cavity. According to this configuration, unnecessary spurious components are effectively reduced and minimized.

Thus, enlarging the area of first cavity enables the chip piezoelectric filter to produce filter characteristics that are much better than those produced by the conventional chip piezoelectric filter.

A chip piezoelectric filter according to another preferred embodiment of the present invention further includes first and second spacers that are created by dividing the aforementioned spacer in the thickness direction, and a partitioning substrate that is provided between the first spacer and the second spacer and that has no opening. In this case, the partitioning substrate reduces interference between the first and second piezoelectric filter sections, thereby enabling unnecessary spurious components to be substantially minimized.

A chip piezoelectric filter according to still another preferred embodiment of the present invention preferably includes a circuit configuration wherein the first piezoelectric filter section and the second piezoelectric filter section are electrically connected to each other via an intermediate capacitive section, and an intermediate capacitive section provided on at least one of the first piezoelectric substrate and the second piezoelectric substrate. In this case, the first and second piezoelectric substrates are stacked in the thickness direction. Therefore, the circuit configuration wherein the multiple piezoelectric filters are connected to each other via the intermediate capacitive section is configured as a small independent component.

Also, in the above-described chip piezoelectric filter according to preferred embodiments of the present invention, the intermediate capacitive section may be provided with a pair of electrodes opposing each other with respect to the front and reverse surfaces via one of the first piezoelectric substrate and the second piezoelectric substrate.

As described above, the intermediate capacitive section is provided on at least one of the first and second piezoelectric substrates. That is, the intermediate capacitive section is provided on the same substrate on which the piezoelectric filter section is also provided. Therefore, there is very little difference between temperature characteristics of the intermediate capacitive section and the piezoelectric filter section, thereby providing stabilized temperature characteristics of the overall chip piezoelectric filter.

In addition, in the chip piezoelectric filter according to preferred embodiments of the present invention, each of the first piezoelectric filter section and the second piezoelectric filter section may include a pair of resonant electrodes provided on one of the main surfaces of each of the first piezoelectric substrate and the second piezoelectric substrate, and common electrodes opposing each other with respect to the front and reverse surfaces via the pair of resonant electrodes and one of the first piezoelectric substrate and the second piezoelectric substrate.

Furthermore, in the chip piezoelectric filter according to preferred embodiments of the present invention, the first piezoelectric substrate and the second piezoelectric substrate are stacked so that the common electrodes in the first piezoelectric filter section and the second piezoelectric filter section inwardly face each other. In this case, the common electrodes are connected to ground potentials so as to oppose each other between the first and second piezoelectric filters. Therefore, capacitance floating between the first and second piezoelectric filters is substantially reduced, thereby providing excellent filter characteristics.

Other features, characteristics, elements and advantages of the present invention will become apparent from the following description of preferred embodiments thereof with reference to the attached drawings.

DETAILED DESCRIPTION OF PREFERRED EMBODIMENTS

Hereinbelow, a description will be provided of preferred embodiments to further illustrate the present invention.

Figure 1:
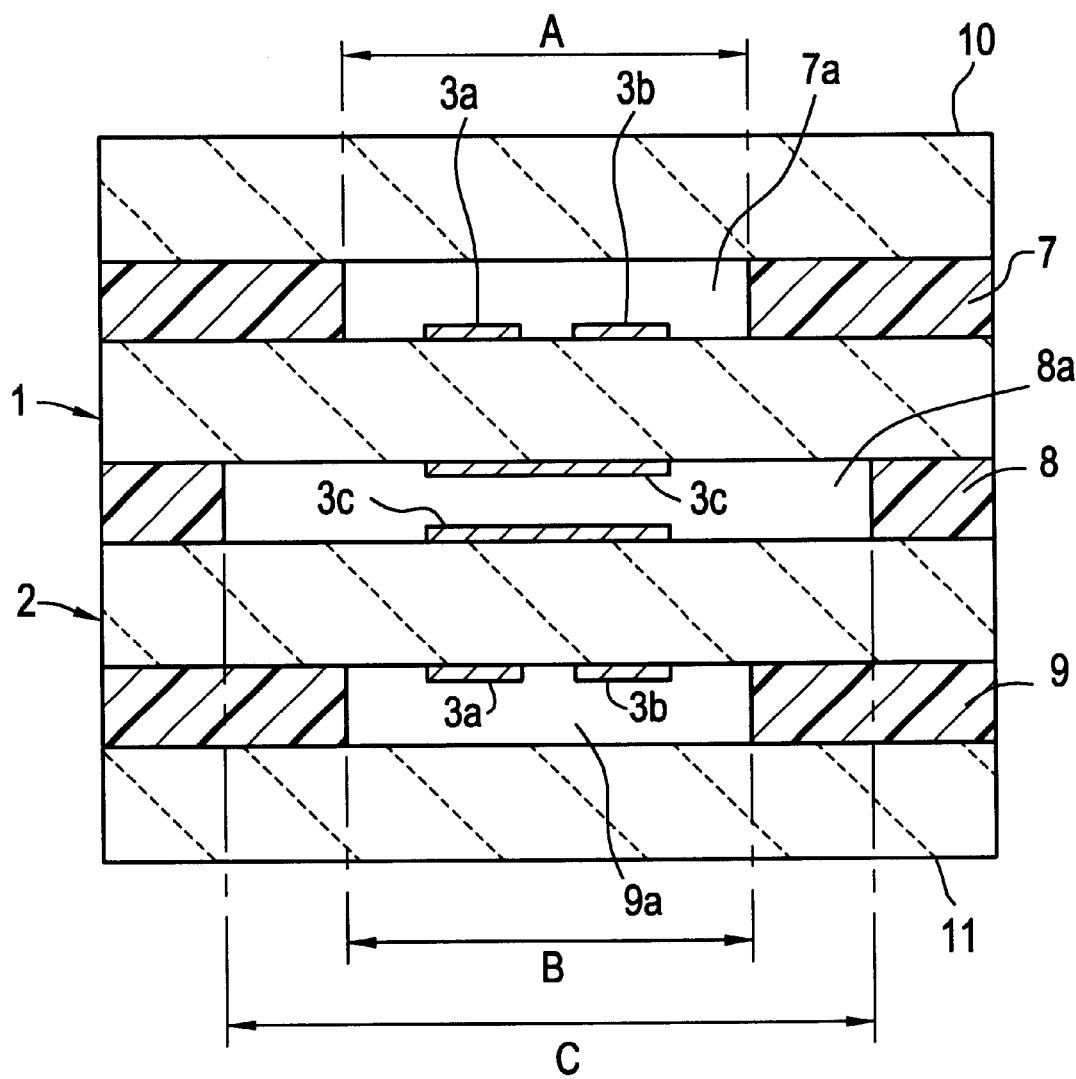
FIG. 1 is a cross-sectional view of a chip piezoelectric filter according to a first preferred embodiment of the present invention.
Figure 2:
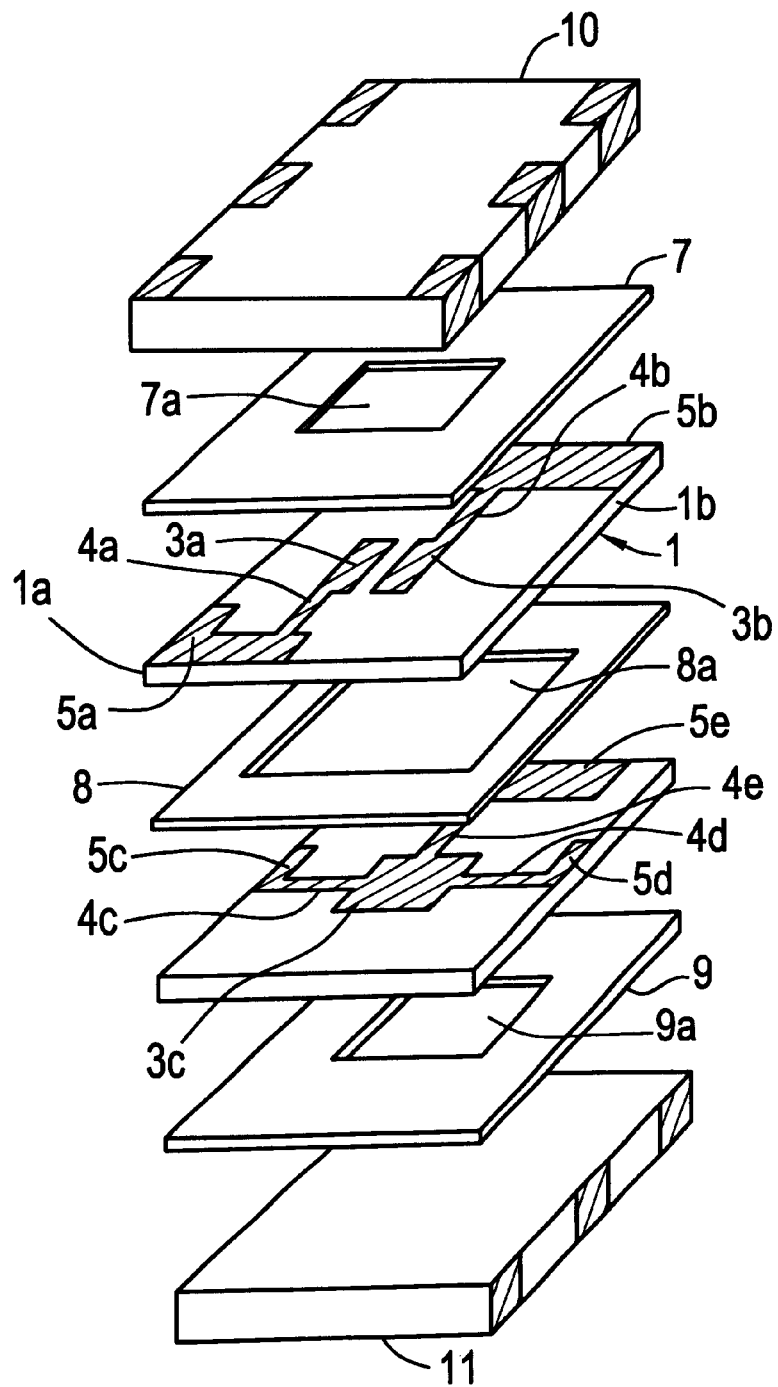
FIG. 2 is an exploded perspective view of the chip piezoelectric filter according to the first preferred embodiment of the present invention.

FIG. 1 is a cross-sectional view of a chip piezoelectric filter according to a first preferred embodiment of the present invention. FIG. 2 is an exploded perspective view of the chip piezoelectric filter according to the first preferred embodiment of the present invention.

The chip piezoelectric filter preferably includes a first substrate 1 and a second substrate 2, each of which preferably has a substantially rectangular shape. Each of the first and second piezoelectric substrates 1 and 2 is preferably made of a piezoelectric ceramic, such as a titanate-zirconate-group ceramic material, a piezoelectric monocrystal, such as crystal, or other suitable material. When the first and second piezoelectric substrates 1 and 2 are made of the piezoelectric ceramic, they are polarized in the thickness direction.

On the first piezoelectric substrate 1, a first piezoelectric filter section is provided. Similarly, a second piezoelectric filter section is provided on the second piezoelectric substrate 2. Either the first piezoelectric filter section or the second piezoelectric filter section is an energy-trap type that vibrates in a thickness-vertical oscillation mode. Also, an intermediate capacitive section is provided on each of the first and second piezoelectric substrates 1 and 2.

Figure 3:
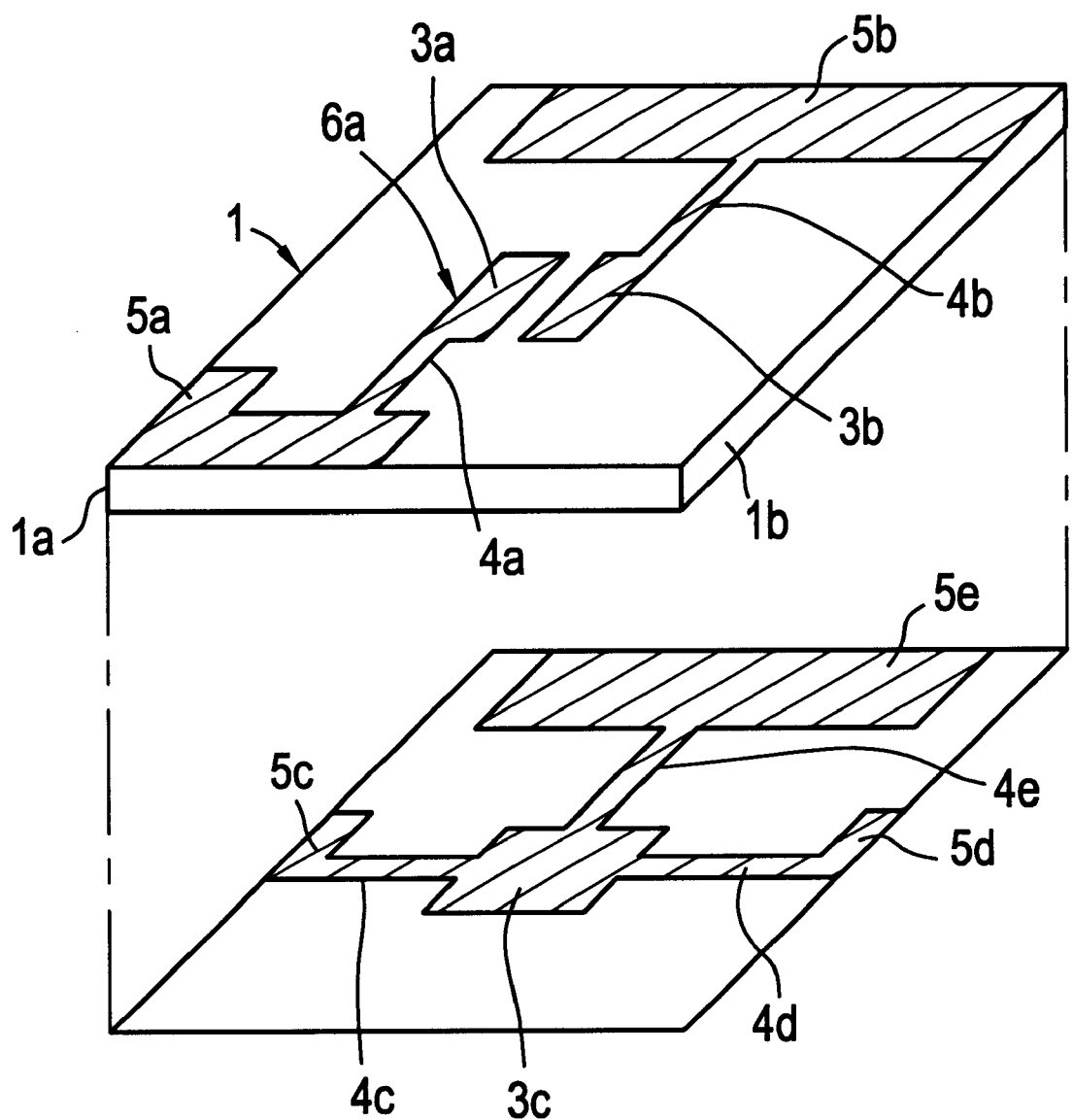
FIG. 3 is a perspective view illustrating the electrodes provided on a first piezoelectric substrate in the first preferred embodiment shown in FIG. 1.

FIG. 3 is a perspective view of the first piezoelectric substrate 1. The lower portion of the figure is a projected view of electrodes provided on the lower surface of the first piezoelectric substrate 1.

On the upper surface of the first piezoelectric substrate 1, a pair of resonant electrodes 3a and 3b is provided. The resonant electrodes 3a and 3b are provided in an approximately central area of the upper surface so as to oppose each other via a predetermined gap. Also, a common electrode 3c is provided on the lower surface of the first piezoelectric substrate 1 so as to oppose the resonant electrodes 3a and 3b.

The resonant electrode 3a is connected to an extension electrode 5a via a conductive connection section 4a. The extension electrode 5a is extended to a peripheral surface 1a of the first piezoelectric substrate 1. The resonant electrode 3b is connected via a conductive connection section 4b to a capacitive electrode 5b that is shared as an extension electrode. The capacitive electrode 5b extends to a peripheral surface 1b that opposes the peripheral surface 1a.

On the lower surface of the first piezoelectric substrate 1, the common electrode 3c is connected to extension electrodes 5c and 5d through respective conductive connection sections 4c and 4d. The extension electrodes 5c and 5d are provided along the respective peripheral surfaces 1a and 1b of the first piezoelectric substrate 1. The common electrode 3c is also connected to a capacitive electrode 5e via a conductive connection section 4e. The reverse surface of the capacitive electrode 5e opposes the front surface of the capacitive electrode 5b via the first piezoelectric substrate 1, thereby constituting the capacitive section.

Figure 4A:
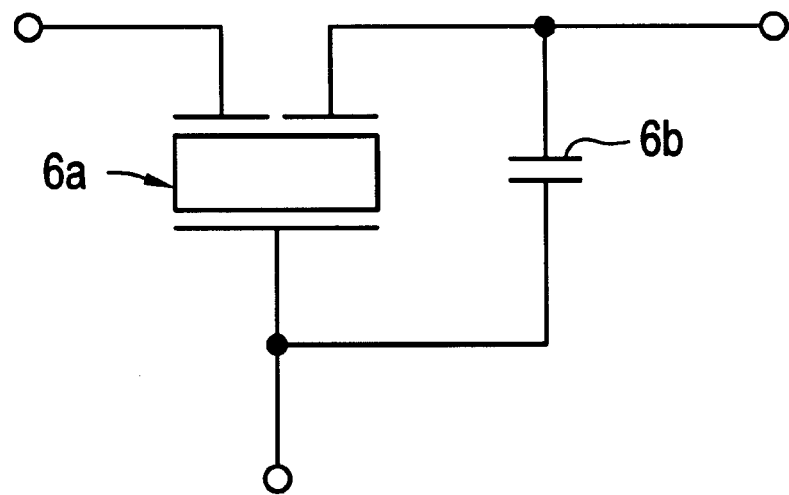
FIG. 4A is a diagram of a circuit provided on the first piezoelectric substrate.

FIG. 4A shows a circuit configuration of the first piezoelectric substrate 1.

A first piezoelectric filter 6a and an intermediate capacitive section 6b are provided on the first piezoelectric substrate 1. The first piezoelectric filter 6a preferably includes the resonant electrodes 3a and 3b and the common electrode 3c. The intermediate capacitive section 6b preferably includes the capacitive electrode 5b and 5e.

Figure 4B:
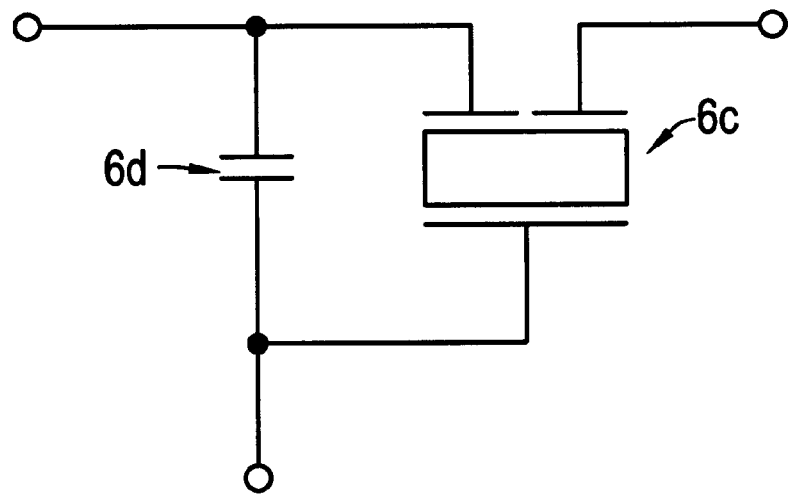
FIG. 4B is a diagram of a circuit provided on a second piezoelectric substrate.

Referring back to FIGS. 1 and 2, the second piezoelectric substrate 2 is preferably the same as the first piezoelectric substrate 1, except that it is oriented upside down. Accordingly, as shown in FIG. 4B, the second piezoelectric substrate 2 has a second piezoelectric filter 6c of the energy-trap type and an intermediate capacitive section 6d.

For electrodes on the second piezoelectric substrate 2, which correspond to those of the first piezoelectric substrate 1 shown in FIG. 2, the same reference symbols are used, and detailed descriptions thereof are omitted.

Reference is now made to FIG. 2. In the chip piezoelectric filter of the first preferred embodiment of the present invention, the first and second piezoelectric substrates 1 and 2 are stacked in the thickness direction thereof and are connected to each other via a spacer 8 and adhesive. Therefore, the common electrodes 3c of the first and second piezoelectric filter sections face inward.

The spacer 8 preferably has a substantially rectangular opening in the approximate center thereof, which defines a first cavity 8a. In an upper portion of the first piezoelectric substrate 1, that is, on the surface opposing the side where the spacer 8 is stacked, a first housing substrate 10 is stacked and joined adhesively via a spacer 7. Similarly, a second housing substrate 11 is stacked on the lower surface of the second piezoelectric substrate 2 via a spacer 9. Each of the spacers 7 and 9 has an opening in the approximate center thereof. As shown in FIGS. 1 and 2, the opening in the spacer 7 provides a second cavity 7a, and the opening in the spacer 9 provides a third cavity 9a.

The first housing substrate 10 and the spacer 7 define a first confining substrate. Also, the second housing substrate 11 and the spacer 9 define a second confining substrate. To make each of the spacers 7 to 9, a resin frame material may be used, or an adhesive may be applied and cured so as to be in the planar shape, or other suitable methods may be used. Also, instead of providing the spacers 7 and 9, a concave section may be provided on the inner main surface of each of the first and second housing substrates 10 and 11. That is, instead of the first and second housing substrates 10 and 11, confining substrates each having the concave section may be used to provide the second and third cavities 7a and 9a.

As a characteristic of the chip piezoelectric filter of the first preferred embodiment, the area of the first cavity 8a is larger than that of each of the second and third cavities 7a and 9a. For example, as in this preferred embodiment, each of the first to third cavities 7a to 9a is preferably substantially rectangular, a length C of one of the sides of the first cavity 8a is longer than either a length A of one of the sides of the second cavity 7a or than a length B of one of the sides of the third cavity 9a. However, the sizes of the first and second cavities 7a and 9a may be the same or may be different from each other. Also, each of the first to third cavities 7a to 9a is not limited to be substantially rectangular, but may be substantially circular or may have other suitable shapes.

Thus, in the chip piezoelectric filter of the first preferred embodiment, the area of the first cavity 8a is larger than that of each of the second and third cavities 7a and 9a, thereby reducing unnecessary spurious components in areas other than passbands. The inventor verified the above by performing experiments.

The experiments were performed to reduce the spurious components in areas other than passbands in the conventional chip piezoelectric filter 51 described in the description of the related art section of this application. As a result, it was discovered that when the first cavity is larger than that of each of the second and third cavities, unnecessary spurious components are substantially reduced.

Hereinbelow, a detailed description will be provided of practical examples used in the experiments to verify that preferred embodiments of the present invention are capable of reducing and minimizing the unnecessary spurious components.

For each of the first and second piezoelectric substrates 1 and 2, a substrate that is made of the titanate-zirconate-group ceramic and that is approximately 3.45 mm×3.1 mm×0.2 mm (thickness) in size. In the center of each of the substrates, resonant electrodes each being approximately 0.40 mm×1.00 mm in size were provided so as to sandwich a gap of about 0.20 mm, and a common electrode being approximately 1.40 mm×0.77 mm in size was provided on the opposite surface. Also, as a spacer corresponding to the spacer 8, an epoxy-group adhesive was applied so as to have a thickness of about 0.2 mm after curing. To provide the first cavity 8a, a rectangular opening being about 2.2 mm×2.5 mm in size was provided in the center in the spacer corresponding to the spacer 8.

For each of the first and second confining substrates, an insulating substrate made of a titanate magnesium material and being about 3.45 mm×3.1 mm×0.5 mm (thickness) in size was used. In an inner surface of the insulating substrate, a substantially square concave section being approximately 2.0 mm×2.0 mm×0.10 mm (depth) in size was provided. As a result, cavities corresponding to the second and third 7a and 9a were provided.

For comparison, a conventional chip piezoelectric filter was produced for experimental purposes so as to be the same as the first preferred embodiment except that all of the first, second and third cavities were 2.0 mm×2.0 mm in size.

Figure 5:
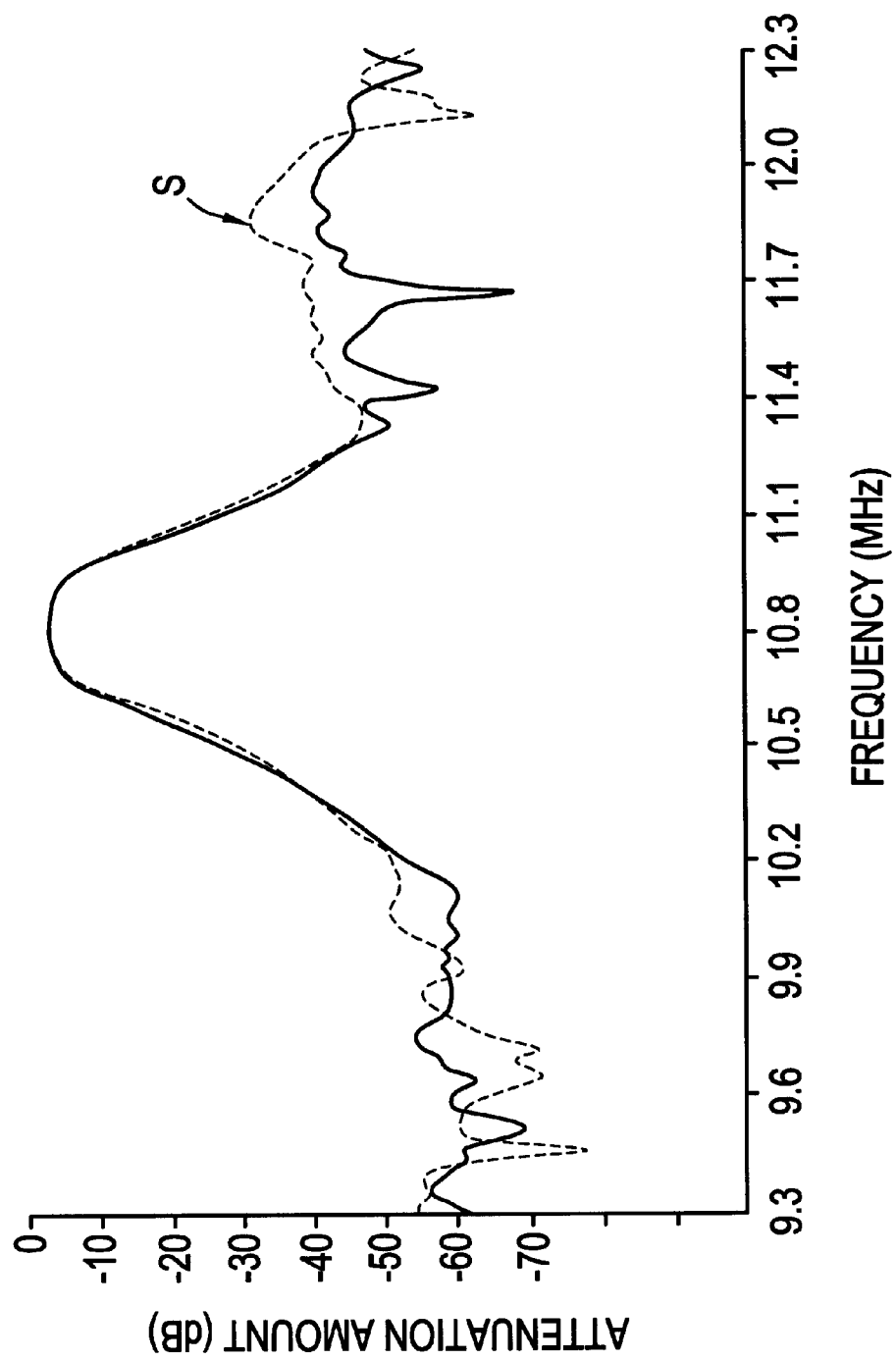
FIG. 5 is a graph showing attenuation-frequency characteristics of the chip piezoelectric filter according to the first preferred embodiment and a conventional chip piezoelectric filter.

In FIG. 5, attenuation-frequency characteristics of the chip piezoelectric filter according to the first preferred embodiment are shown by a solid line, and attenuation-frequency characteristics of the conventional chip piezoelectric filter are shown by a broken line.

As is apparent in the FIG. 5, spurious components produced in the conventional chip piezoelectric filter are noticeable as indicated by an arrow S, while the spurious components are substantially reduced in the chip piezoelectric filter of the first preferred embodiment.

As described above, according to preferred embodiments of the present invention, the area of the first cavity is larger than that of each of the second and third cavity, thereby effectively reducing unnecessary spurious components in areas other than passbands. The unnecessary spurious components are reduced as described above for the reason described below.

The spurious components are caused by interference of spurious oscillations of the upper and lower piezoelectric substrates. Therefore, as in the first preferred embodiment, when the area of the first cavity is increased, interference between the first and second piezoelectric filter sections is reduced. In addition, since the cavities on the sides of the upper and lower housing substrates are smaller than the first cavity, the unnecessary spurious components are effectively suppressed.

Figure 6:
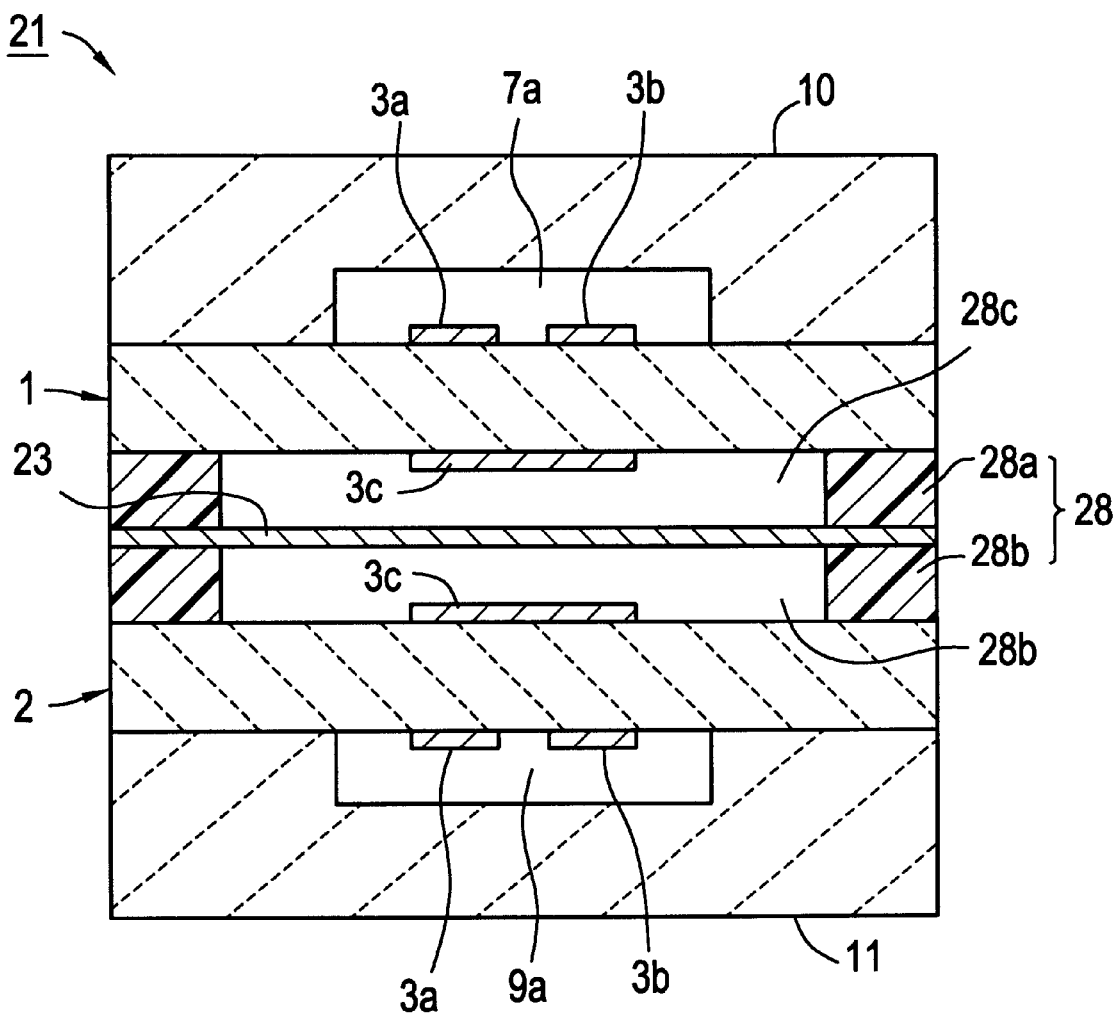
FIG. 6 is a cross-sectional view of a chip piezoelectric filter according to a second preferred embodiment of the present invention.
Figure 7:
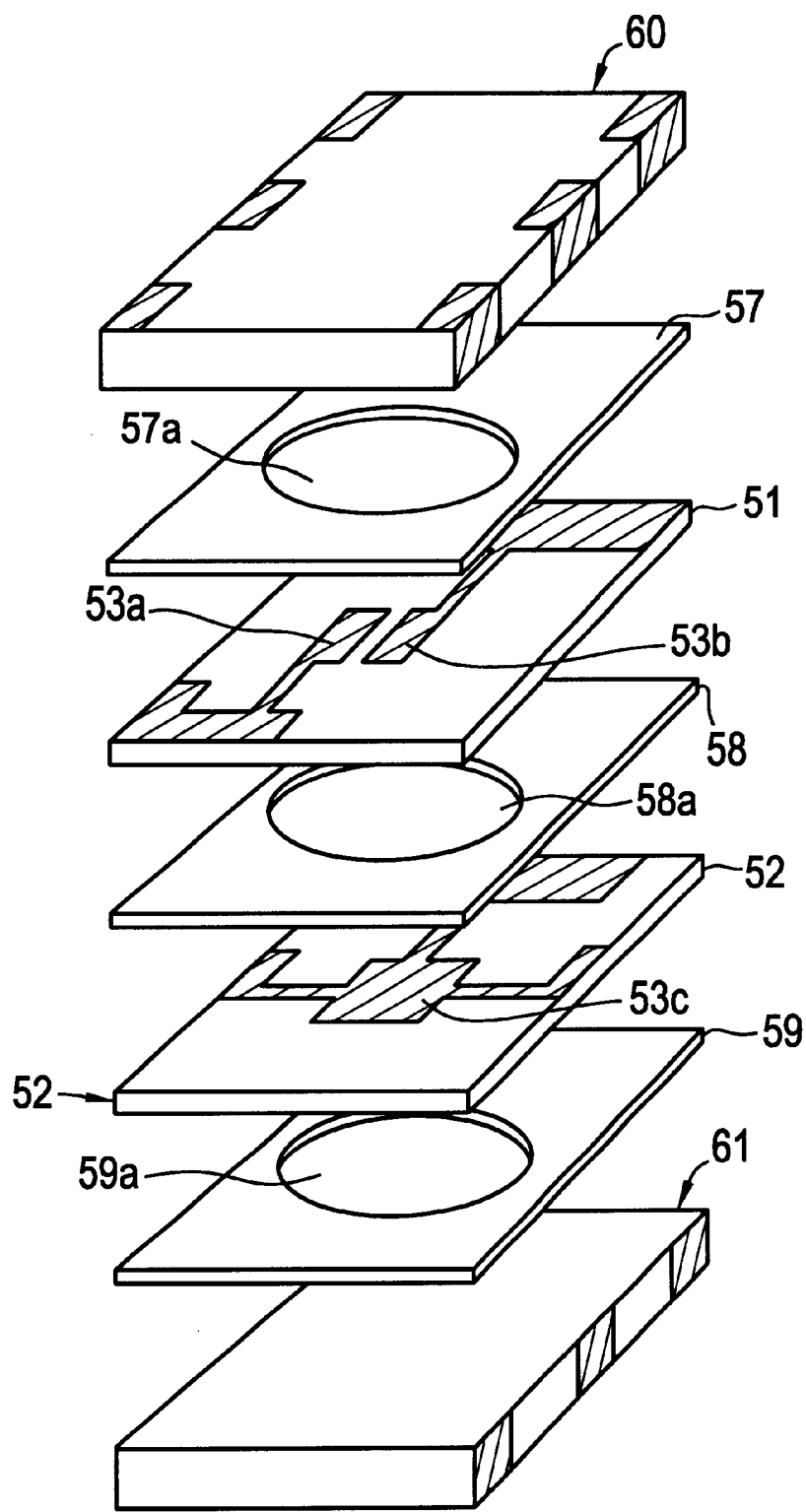
FIG. 7 is a cross-sectional view of the conventional chip piezoelectric filter.
Figure 8:
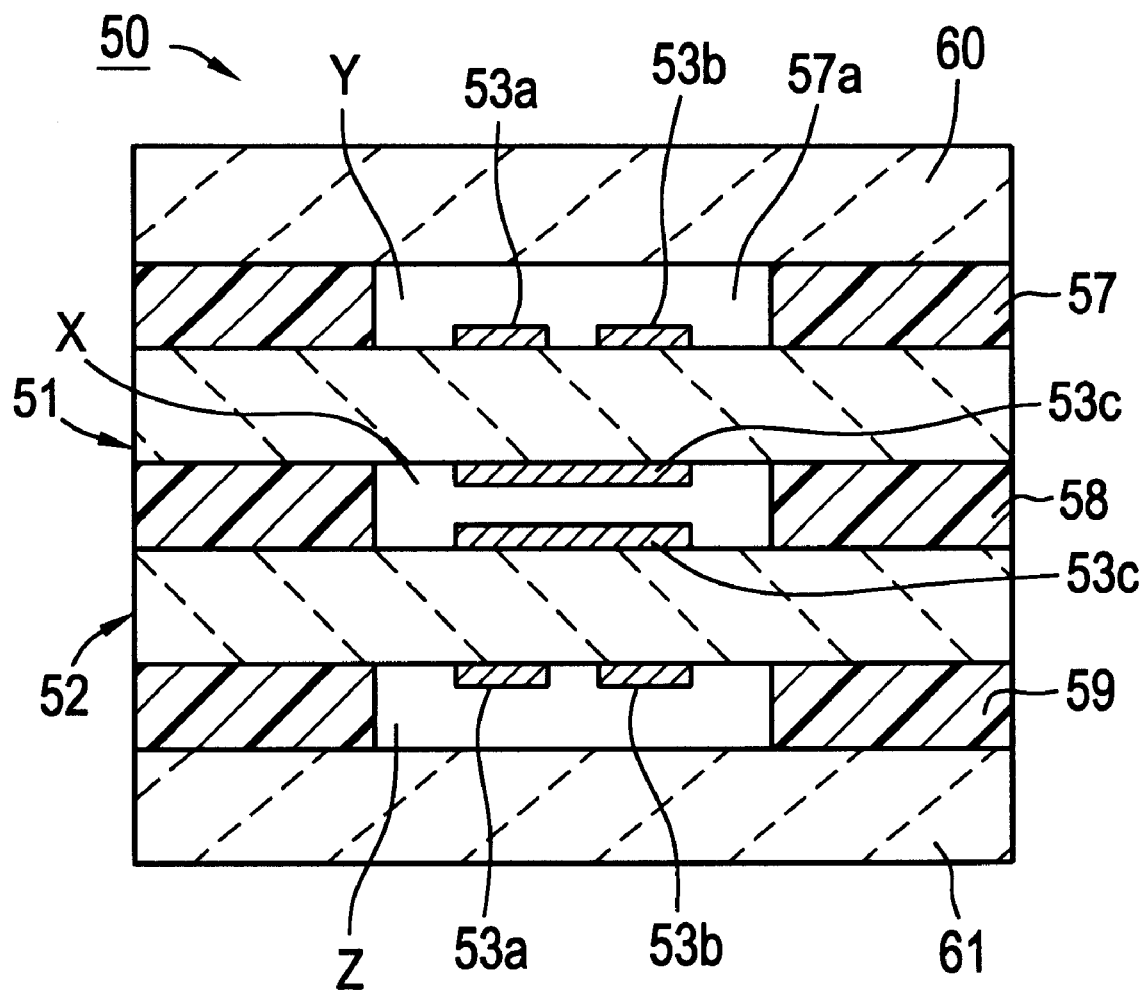
FIG. 8 is an exploded perspective view of the conventional chip piezoelectric filter.

FIG. 6 is a cross-sectional view of a chip piezoelectric filter 21 according to a second preferred embodiment of the present invention. In the chip piezoelectric filter 21, a spacer 28 is divided in the thickness direction into a first spacer 28a and a second spacer 28b. Between the first and second spacer 28a and 28b, a partitioning substrate 23 is stacked. The partitioning substrate 23 does not have an opening. Other portions of the second preferred embodiment are preferably the same as in the case of the chip piezoelectric filter according to the first preferred embodiment of the present invention.

In the second preferred embodiment, the partitioning substrate 23 is arranged between the first and second piezoelectric substrates 1 and 2 to divide a cavity corresponding to the first cavity in the first preferred embodiment in the thickness direction into cavities 28c and 28d. In this configuration, similarly to the first preferred embodiment, spurious components in areas other than pass bands are substantially reduced by providing the first cavity (which is divided into the cavities 28c and 28d) having an area larger than that of each of second and third cavities 7a and 9a.

In the first and second preferred embodiments, the intermediate capacitive sections are individually provided in the first and second piezoelectric substrates 1 and 2. However, the present invention may be applied to a chip piezoelectric filter that does not have the intermediate capacitive sections.

Also, in the first and second preferred embodiments, the piezoelectric filter sections of the energy-trap type that vibrate in a thickness-vertical oscillation mode are preferably provided. However, piezoelectric filter sections that vibrate in other oscillation modes, such as a thickness-sliding mode may be provided.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A chip piezoelectric filter comprising:
   a first piezoelectric substrate on which a first energy-trap piezoelectric filter section is provided;
   a second piezoelectric substrate on which a second energy-trap piezoelectric filter section is provided, the second piezoelectric substrate being stacked on the first piezoelectric substrate;
   a spacer stacked between said first piezoelectric substrate and the second piezoelectric substrate and having an opening defining a first cavity arranged to prevent interference of vibrations of said first energy-trap piezoelectric filter section and said second energy-trap piezoelectric filter section;
   a first confining substrate stacked on a surface of the first piezoelectric substrate opposing the surface on which said spacer is stacked to define a second cavity that is arranged to prevent interference of vibrations of said first piezoelectric filter section; and
   a second confining substrate stacked on a surface of the second piezoelectric substrate opposing the surface on which said spacer is stacked to define a third cavity that is arranged to prevent interference of vibrations of said second piezoelectric filter section;
   wherein the area of said at least one of said first, second and third cavities is different from the remaining two of said first, second and third cavities.

2. A chip piezoelectric filter according to claim 1, wherein an area of said first cavity is larger than the areas of both of said second cavity and said third cavity.

3. A chip piezoelectric filter according to claim 1, wherein said spacer is divided in the thickness direction thereof to define a first spacer and a second spacer.

4. A chip piezoelectric filter according to claim 3, further comprising a partitioning substrate that is provided between said first spacer and said second spacer and that has no opening.

5. A chip piezoelectric filter according to claim 1, further comprising an intermediate capacitive section provided on at least one of said first piezoelectric substrate and said second piezoelectric substrate.

6. A chip piezoelectric filter according to claim 5, wherein said first piezoelectric filter section and said second piezoelectric filter section are electrically connected to each other via said intermediate capacitive section.

7. A chip piezoelectric filter according to claim 6, wherein said intermediate capacitive section is provided with a pair of electrodes opposing each other with respect to front and reverse surfaces thereof via one of said first piezoelectric substrate and said second piezoelectric substrate.

8. A chip piezoelectric filter according to claim 1, wherein each of said first piezoelectric filter section and said second piezoelectric filter section includes a pair of resonant electrodes provided on one main surface of each of said first piezoelectric substrate and said second piezoelectric substrate, and common electrodes opposing each other with respect to front and reverse surfaces via said pair of resonant electrodes and one of said first piezoelectric substrate and said second piezoelectric substrate.

9. A chip piezoelectric filter according to claim 8, wherein said first piezoelectric substrate and said second piezoelectric substrate are stacked so that said common electrodes in said first piezoelectric filter section and said second piezoelectric filter section inwardly face each other.

10. A chip piezoelectric filter according to claim 1, wherein the first and second substrates are substantially rectangular and have substantially the same shape.

11. A chip piezoelectric filter according to claim 1, wherein the first and second piezoelectric substrates are polarized in the thickness direction thereof.

12. A chip piezoelectric filter according to claim 1, wherein each of the first, second and third cavities is substantially rectangular.

13. A chip piezoelectric filter comprising:
   a first piezoelectric substrate on which a first piezoelectric filter section is provided;
   a second piezoelectric substrate on which a second piezoelectric filter section is provided, the second piezoelectric substrate being stacked on the first piezoelectric substrate;
   a spacer stacked between said first piezoelectric substrate and the second piezoelectric substrate and having an opening defining a first cavity;
   a first confining substrate stacked on a surface of the first piezoelectric substrate opposing the surface on which said spacer is stacked to define a second cavity; and
   a second confining substrate stacked on a surface of the second piezoelectric substrate opposing the surface on which said spacer is stacked to define a third cavity;
   wherein the area of said at least one of said first, second and third cavities is different from the remaining two of said first, second and third cavities.

14. A chip piezoelectric filter according to claim 13, wherein an area of said first cavity is larger than the areas of both of said second cavity and said third cavity.

15. A chip piezoelectric filter according to claim 13, wherein the first and second piezoelectric filter sections are energy-trap filter sections that vibrate in a thickness-vertical oscillation mode.

16. A chip piezoelectric filter according to claim 15, wherein the first, second and third cavities are arranged to prevent interference of vibrations of said first and second piezoelectric filter sections.

17. A chip piezoelectric filter according to claim 13, wherein said spacer is divided in the thickness direction thereof to define a first spacer and a second spacer.

18. A chip piezoelectric filter according to claim 17, further comprising a partitioning substrate that is provided between said first spacer and said second spacer and that has no opening.

19. A chip piezoelectric filter according to claim 13, further comprising an intermediate capacitive section provided on at least one of said first piezoelectric substrate and said second piezoelectric substrate, and said first piezoelectric filter section and said second piezoelectric filter section are electrically connected to each other via said intermediate capacitive section.

20. A chip piezoelectric filter according to claim 19, wherein said intermediate capacitive section is provided with a pair of electrodes opposing each other with respect to front and reverse surfaces thereof via one of said first piezoelectric substrate and said second piezoelectric substrate.

21. A chip piezoelectric filter according to claim 13, wherein each of said first piezoelectric filter section and said second piezoelectric filter section includes a pair of resonant electrodes provided on one main surface of each of said first piezoelectric substrate and said second piezoelectric substrate, and common electrodes opposing each other with respect to front and reverse surfaces via said pair of resonant electrodes and one of said first piezoelectric substrate and said second piezoelectric substrate.

22. A chip piezoelectric filter according to claim 21, wherein said first piezoelectric substrate and said second piezoelectric substrate are stacked so that said common electrodes in said first piezoelectric filter section and said second piezoelectric filter section inwardly face each other.

23. A chip piezoelectric filter according to claim 13, wherein the first and second substrates are substantially rectangular and have substantially the same shape.

24. A chip piezoelectric filter according to claim 13, wherein the first and second piezoelectric substrates are polarized in the thickness direction thereof.

25. A chip piezoelectric filter according to claim 13, wherein each of the first, second and third cavities is substantially rectangular.

* * * * *